United States Patent
Manapat et al.

(10) Patent No.: US 7,046,580 B1
(45) Date of Patent: May 16, 2006

(54) APPARATUS AND METHOD FOR ADDRESS SELECTION

(75) Inventors: Rajesh Manapat, San Jose, CA (US); Kannan Srinivasagam, Sunnyvale, CA (US); Ritesh Mastipuram, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/877,909

(22) Filed: Jun. 25, 2004

Related U.S. Application Data

(60) Provisional application No. 60/483,125, filed on Jun. 27, 2003.

(51) Int. Cl.
*G11C 8/00* (2006.01)
(52) U.S. Cl. ............... 365/238.5; 365/230.03; 365/230.08; 365/233; 365/233.5
(58) Field of Classification Search ............ 365/238.5, 365/230.03, 230.06, 233.5, 233, 230.08
See application file for complete search history.

(56) References Cited

U.S. PATENT DOCUMENTS 5,675,549 A * 10/1997 Ong et al. ................ 365/233.5
5,835,970 A    11/1998 Landry et al.

(Continued)

OTHER PUBLICATIONS

Cypress Preliminary CY7C1305AV25, CY7C1307AV25, 18-Mbit Burst of 4 Pipelined SRAM with QDR™ Architecture, Cypress Semiconductor Corporation, San Jose, CA, Document #: 38-05496, Rev. *A, Revised Jun. 1, 2004, 21 pages.

Cypress Preliminary CY7C1311AV18, CY7C1313AV18, CY7C1315AV18, 18-Mb QDR™-II SRAM 4-Word Burst Architecture, Cypress Semiconductor Corporation, San Jose, CA, Document #: 38-05498, Rev. *A, Revised Jun. 1, 2004, 22 pages.

Cypress Advance Inforamtion, QDR™ II SRAM: A Design Guide, Cypress Semiconductor Corporation, San Jose, CA, Jun. 12, 2002, 6 pages, © Cypress Semiconductor Corporation, 2002.

Cypress, Quad Data Rate™ (QDR™) SRAM Clocking Scheme, Cypress Semiconductor Corporation, San Jose, CA, Feb. 16, 2000, 2 pages, © Cypress Semiconductor Corporation, 2000.

(Continued)

*Primary Examiner*—Son T. Dinh
(74) *Attorney, Agent, or Firm*—Blakely, Sokoloff, Taylor & Zafman LLP

(57) ABSTRACT

An apparatus for address selection including a first storage element and a second storage element coupled to an input bus. The first storage element stores a first address segment and the second storage element stores a second address segment upon the receipt of respective complementary clock signals. An internal address bus propagates the address segments together.

24 Claims, 10 Drawing Sheets

U.S. PATENT DOCUMENTS

| | | | |
|---|---|---|---|
| 5,875,472 A * | 2/1999 | Bauman et al. | 711/150 |
| 6,005,814 A | 12/1999 | Mulholland et al. | |
| 6,262,937 B1 | 7/2001 | Arcoleo et al. | |
| 6,288,948 B1 | 9/2001 | Lutley et al. | |
| 6,385,128 B1 | 5/2002 | Arcoleo et al. | |
| 6,404,682 B1 | 6/2002 | Lutley et al. | |
| 6,480,406 B1 | 11/2002 | Jin et al. | |
| 6,510,483 B1 | 1/2003 | Rezeanu et al. | |
| 6,640,266 B1 | 10/2003 | Arcoleo et al. | |
| 6,721,202 B1 | 4/2004 | Roge et al. | |
| 6,789,180 B1 | 9/2004 | Rezeanu et al. | |
| 6,889,267 B1 * | 5/2005 | Duresky et al. | 710/31 |

OTHER PUBLICATIONS

Cypress Understanding Burst Modes in Synchronous SRAMs, Cypress Semiconductor Corporation, San Jose, CA, Jun. 30, 1999, 2 pages, © Cypress Semiconductor Corporation, 1999.

* cited by examiner

APPARATUS AND METHOD FOR ADDRESS SELECTION

RELATED APPLICATION

This application claims the benefit of U.S. Provisional Application No. 60/483,125, filed Jun. 27, 2003.

TECHNICAL FIELD

Embodiments of the present invention relate to the field of memory devices and, in particular, to the addressing of memory devices.

BACKGROUND

Modern data communication and networking systems make extensive use of synchronous RAM for data processing. FIG. 1 shows a memory architecture of a conventional networking application (e.g., a line card) using synchronous RAM to perform a variety of functions under the control of a processor. In the line card of FIG. 1, data packets from a network are received by the processor and stored in a high-speed memory called a packet buffer. Subsequent processing of the data packets relies on data and instructions that are stored in the other memory structures shown in FIG. 1, such as a lookup table, a queue management memory, a statistics buffer and a policy buffer.

Each of these memories may use synchronous RAM of one type or another. Synchronous RAM is random access memory in which read and write operations are synchronized by the transitions of periodic signals called clock signals. In single data rate (SDR) synchronous RAM, data is transferred on each rising (or falling) edge of a clock signal. In order to achieve higher data transfer rates and maximize data throughput, double data rate (DDR) devices transfer data on both the rising and falling edges of the clock signal (or on the rising or falling edges of two separate clock signals). In order to avoid read/write data collisions on the data bus, separate buses can be provided for reading and writing data, and each bus can operate at double data rates to yield a quad data rate (QDR™) device. A further speed enhancement is achieved with burst-mode read and write operations. In burst-mode, the address provided to the memory specifies the starting point for a burst of data words, to or from the memory, which includes the addressed location and some number of contiguous locations.

The packet buffer is the most demanding memory requirement in the line card of FIG. 1 because data packets can be quite long and the buffer must be very deep to accommodate the network data rate. Packet buffers may use DDR, QDR™ or burst-mode QDR™ RAM. Depending on the specific application, the lookup table, the queue management memory, the statistics buffer and the policy buffer may use DDR, QDR™ or burst-mode QDR™ RAM to keep pace with the packet buffer.

Read and write operations in such memories may be characterized by a latency period. Read latency is the time period between the time that an address of a memory location is specified and the time that data is read from the memory location specified by the address. Write latency is the time period between the time that an address of a memory location is specified and the time that data is actually written to the memory location specified by the address. The latency period, measured in clock cycles, arises from the need to perform one or more intermediate operations before the data can be accessed. For example, before data can be written to a memory address, the address must be decoded and the data must be transferred from an external input port to an internal data register.

FIG. 2 illustrates an interface of a conventional synchronous RAM device. The address input (ADD) is an n-bit wide bus. The data input (D) is an m-bit wide bus, as is the data output (Q). A read enable (RE) signal enables a data read operation. A write enable (WE) signal enables a data write operation. Clock signals k and k# synchronize the READ/WRITE operations.

FIG. 3 illustrates a READ/WRITE timing diagram of a conventional synchronous RAM device, shown with a read latency of 1½ clock cycles and a write latency of 1 clock cycle. Read address A at address input ADD is latched into an address register at time to. Address input ADD is idle at time $t_1$ while address A is processed. Similarly, write address B at address input ADD is latched into the address register at time $t_2$ and address input ADD is idle at time $t_3$ while address B is processed. The sequence is repeated from time $t_4$ to time $t_7$ for addresses C and D.

Because the data rates are high and the processing is complex, multiple banks of synchronous RAM may be required to manage the data traffic. As a result, many address lines are needed to manage the memory and a correspondingly large number of connection points must be provided on the system processor. This creates several problems. First, the internal design of the processor becomes very difficult, costly and time consuming. Second, the layout of the line-card becomes very difficult, costly and time-consuming. Extra circuit layers may be required to accommodate the required line routing. Each additional layer adds to the manufacturing cost of the board and decreases its reliability.

BRIEF DESCRIPTION OF DRAWINGS

The present invention is illustrated by way of example, and not by limitation, in the figures of the accompanying drawings in which.

DETAILED DESCRIPTION

Figure 1:
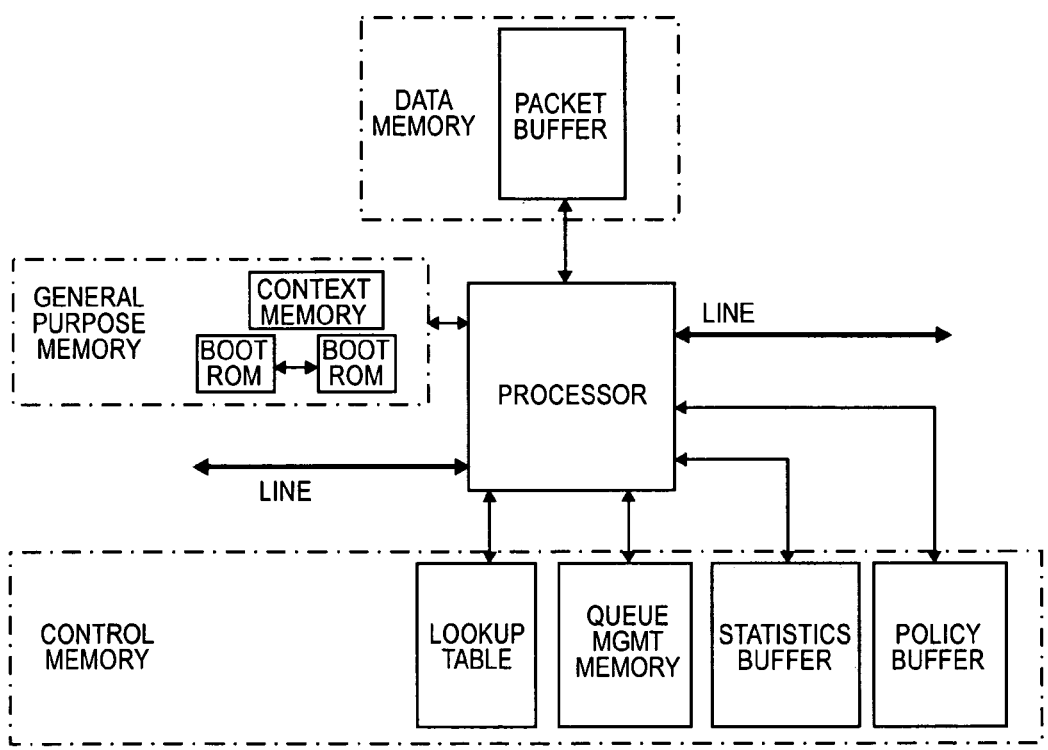
FIG. 1 illustrates a conventional memory architecture of a networking application, including synchronous RAM devices.
Figure 2:
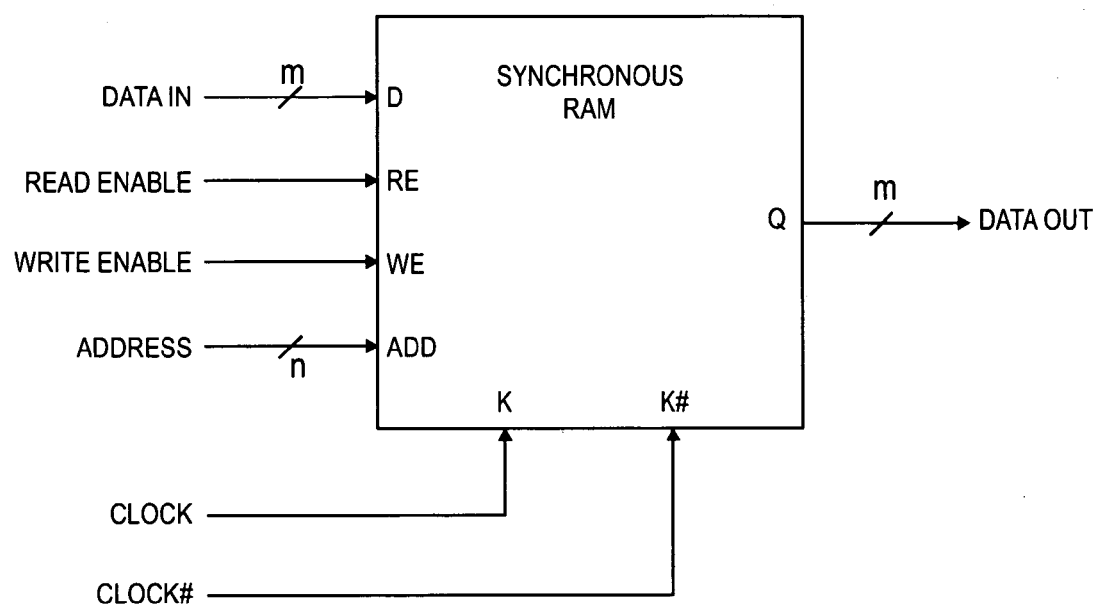
FIG. 2 illustrates an interface of a conventional synchronous RAM device.
Figure 3:
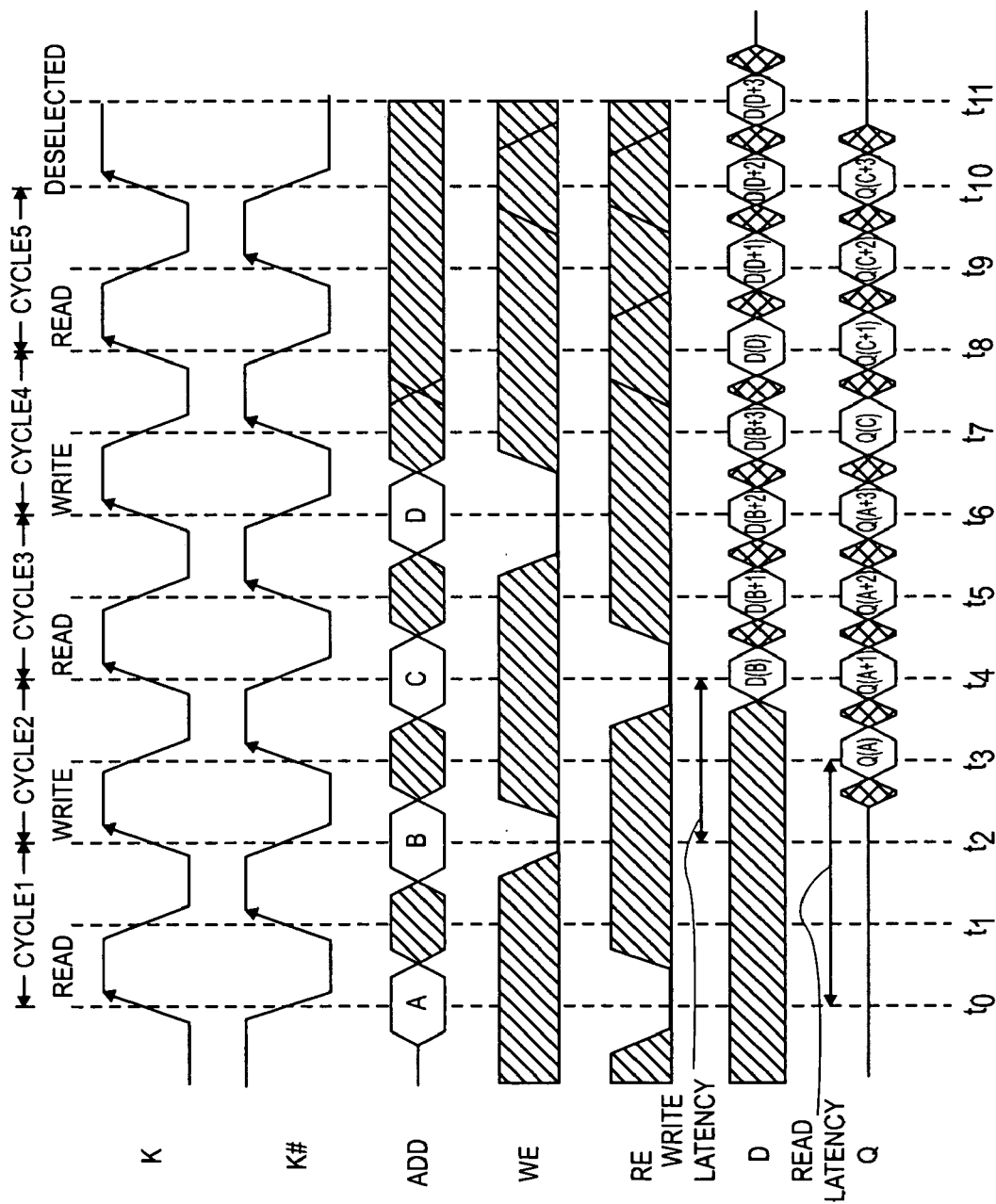
FIG. 3 illustrates a read/write timing diagram of a conventional synchronous SRAM device.

In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention. It should be noted that the "line" or "lines" discussed herein, that connect elements, may be single lines or multiple lines. The term "coupled" as used herein, may mean directly coupled or indirectly coupled through one or more intervening components. It will also be understood by one having ordinary skill in the art that lines and/or other coupling elements may be identified by the nature of the signals they carry (e.g., a "clock line" may implicitly carry a "clock signal") and that input and output ports may be identified by the nature of the signals they receive or transmit (e.g., "clock input k" may implicitly receive a "clock signal k").

A system, apparatus and method for address selection are described. In one embodiment, the system includes a processing device that is coupled to a random access memory (RAM) device by a data bus, a system address bus and a pair of clock signal lines. The processing device includes a clock generator that generates a first clock signal and a second clock signal on one or more clock signal lines. The random access memory (RAM) device includes an input address bus coupled to the system address bus. A first storage element with an equal number of inputs and outputs is coupled to the input address bus to receive and store a first memory address segment from the system address bus. A second storage element with an equal number of inputs and outputs is coupled to the input address bus to receive and store a second memory address segment from the system address bus. The first storage element receives and stores the first memory address segment on a first transition of the first clock signal and the second storage element receives and stores the second memory address segment on a first transition of the second clock signal. The first and second storage elements form an internal memory address at their outputs from the first and second memory address segments and propagate the internal memory address on an internal memory address bus.

In one embodiment, the method receives and stores a first and a second memory address segment, during a latency period, on consecutive half cycles of clock signals. An internal memory address formed from the first and second memory address segments is propagated on an internal address bus to an address decoder on a third consecutive half cycle of the clock signals within the latency period.

The described memory addressing may be used to reduce the number of memory address lines in a networking or data communications application, for example, by approximately a factor of two, without reducing the amount of addressable memory or increasing memory access times.

Figure 4:
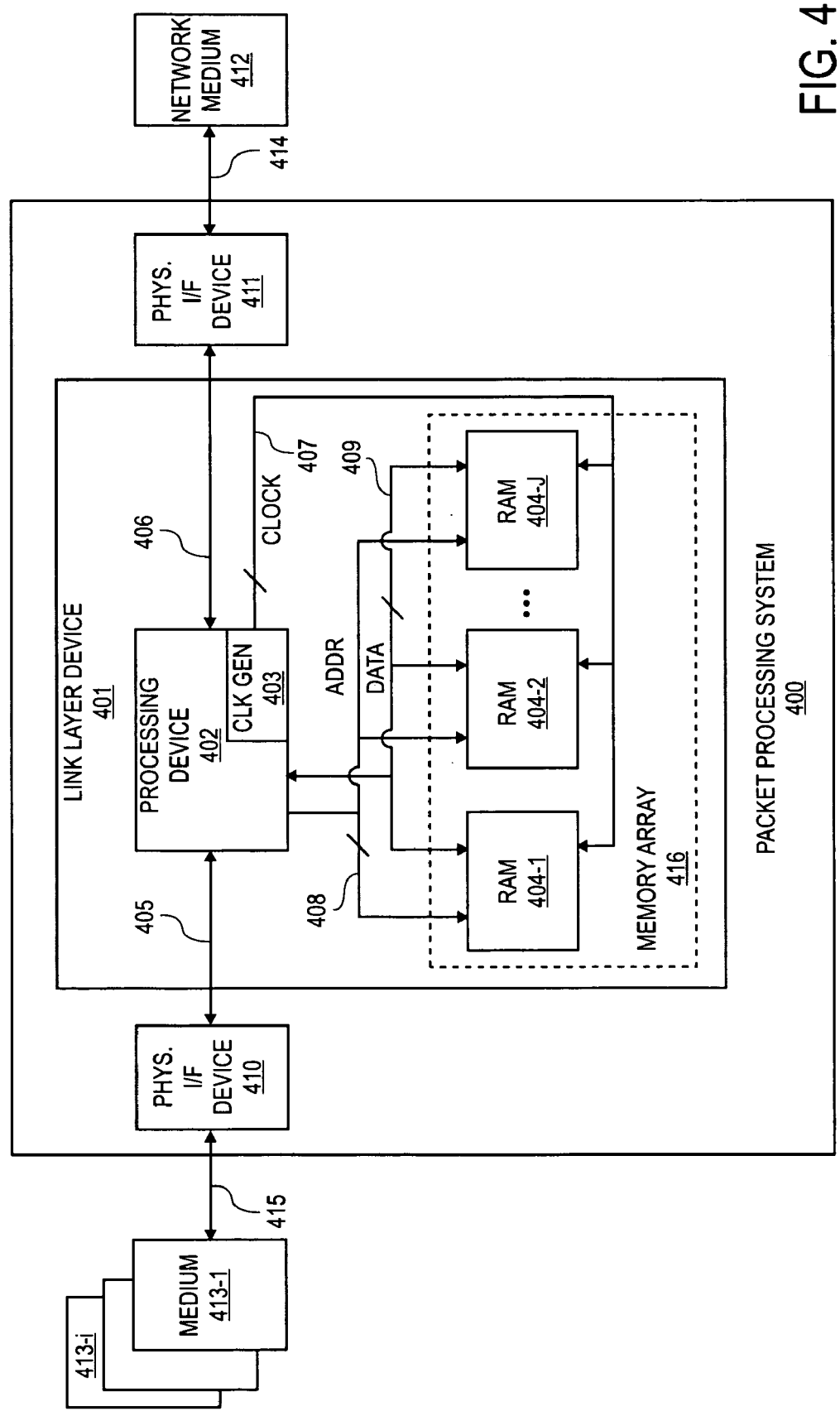
FIG. 4 illustrates one embodiment of addressing synchronous RAM in a packet processing system.

FIG. 4 illustrates one embodiment of addressing synchronous RAM in a packet processing system. Packet processing system 400 may be used in a communication system such as a computer, server, router, switch load balancer, add/drop multiplexer, digital cross-connect, or other piece of communications equipment. Packet processing system 400, for example, may be implemented in a line card that links external network connections to each other. Examples of line cards include a switch-fabric card, a time-division multiplexed data card, an Ethernet data card and an optical carrier card. The communication system that hosts the line card may have, for example, a chassis and a backplane with many slots into which one or more line cards may be mounted. The line cards may be removed or inserted to change the number of ports or to support different communication protocols or physical interface devices. Alternatively, packet-processing system 400 may be implemented in other cards or integrated into other system components.

Packet processing system 400 may be coupled to network medium 412 by line 414, and to one or more mediums $413_1$–$413_i$ by line 415. Mediums $413_1$–$413_i$ may be similar or dissimilar mediums. Packet processing system 400 may include physical interface devices 410 and 411 coupled to link layer device 401 by lines 405 and 406, respectively. Link layer device 401 may include processing device 402 for processing data packets. Processing device 402 may be, for example, a network processor, a field programmable gate array (FPGA) or an application specific integrated circuit (ASIC). Alternatively, processing device 402 may be one or more other processing devices such as a general-purpose processor (e.g., a Motorola PowerPC™ processor or Intel® Pentium® processor) or a special-purpose processor (e.g., a digital signal processor). Processing device 402 may include clock generator 403 to generate clock signals. Link layer device 401 may also include memory array 416 for storing information (e.g., data packets) and instructions to be executed by processing device 402. Memory array 416 may include memory devices $404_1$–$404_J$. Each of memory devices $404_1$–$404_J$ may be synchronous random access memory (RAM) devices. Memory devices $404_1$–$404_J$ may also be either static random access memory devices (SRAM) or dynamic random access memory (DRAM) devices. RAM devices $404_1$–$404_J$ may be DDR memory devices or QDR™ memory devices. Memory devices $404_1$–$404_J$ may be coupled to processing device 402 by clock lines 407, system address bus 408, and data bus 409. Each of memory devices $404_1$–$404_J$ may be used to store data packets or data and instructions for processing data packets. Processing data may include, for example, processing statistics or routing addresses. Processing instructions may include, for example, queue management instructions or packet routing policy instructions. Each memory device $404_1$–$404_J$ may include $2^n$ addressable memory locations. In one embodiment, n may be an even number and system address bus 408 may contain n/2 address lines. In an alternative embodiment, n may be an odd number and system address bus 408 may include (n+1)/2 address lines. System address bus 408 may also include one or more chip select lines in addition to address lines. Data bus 409 may include m bi-directional data lines to carry data to and from memory devices $404_1$–$404_J$. Alternatively, data bus 409 may include m unidirectional data lines to carry data to memory devices $404_1$–$404_J$ and m unidirectional data lines to carry data from memory devices $404_1$–$404_J$. Memory devices $404_1$–$404_J$ may be coupled to clock generator 403 by one or more clock lines 407. It should be noted that link layer device 401 may also include other components and couplings that have not been illustrated, so as not to obscure an understanding of embodiments of the present invention.

Figure 5A:
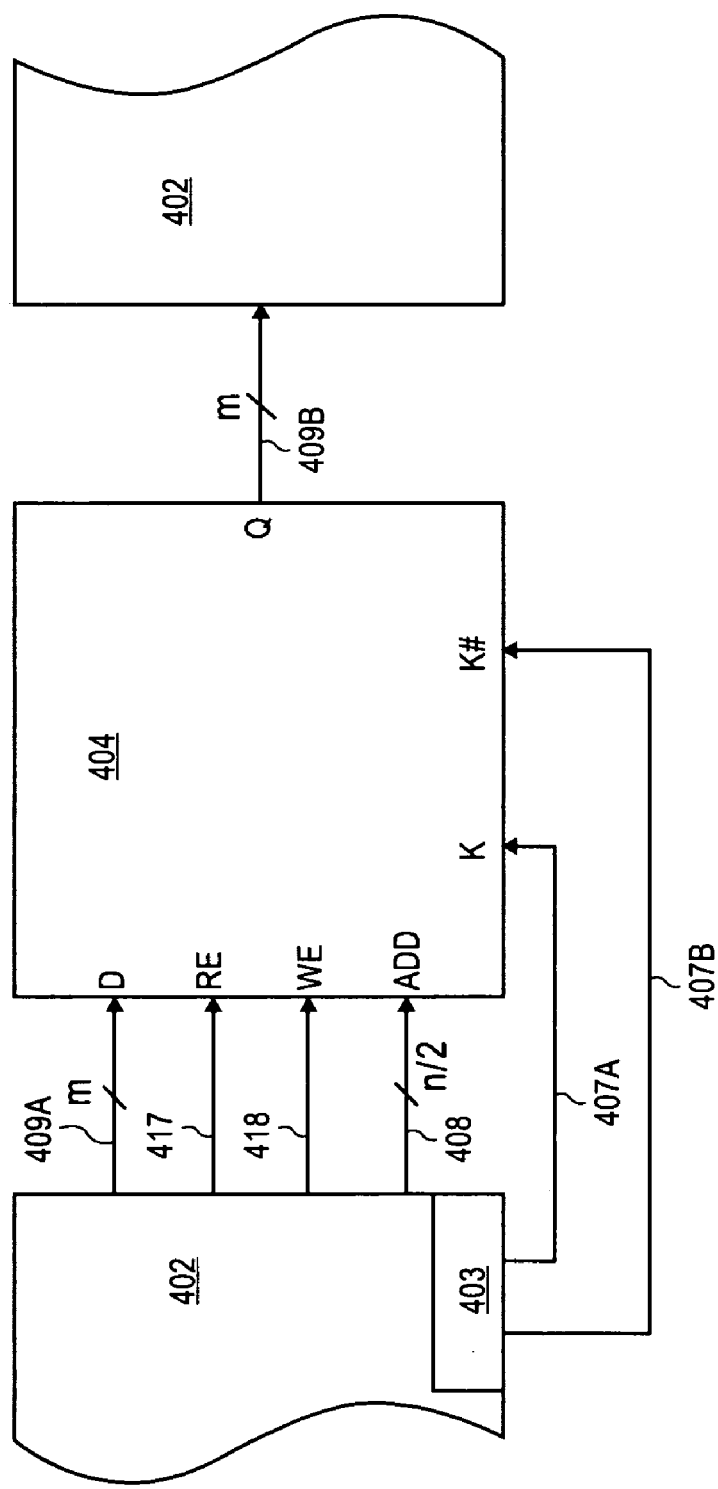
FIG. 5A illustrates one embodiment of addressing a synchronous RAM device.
Figure 5B:
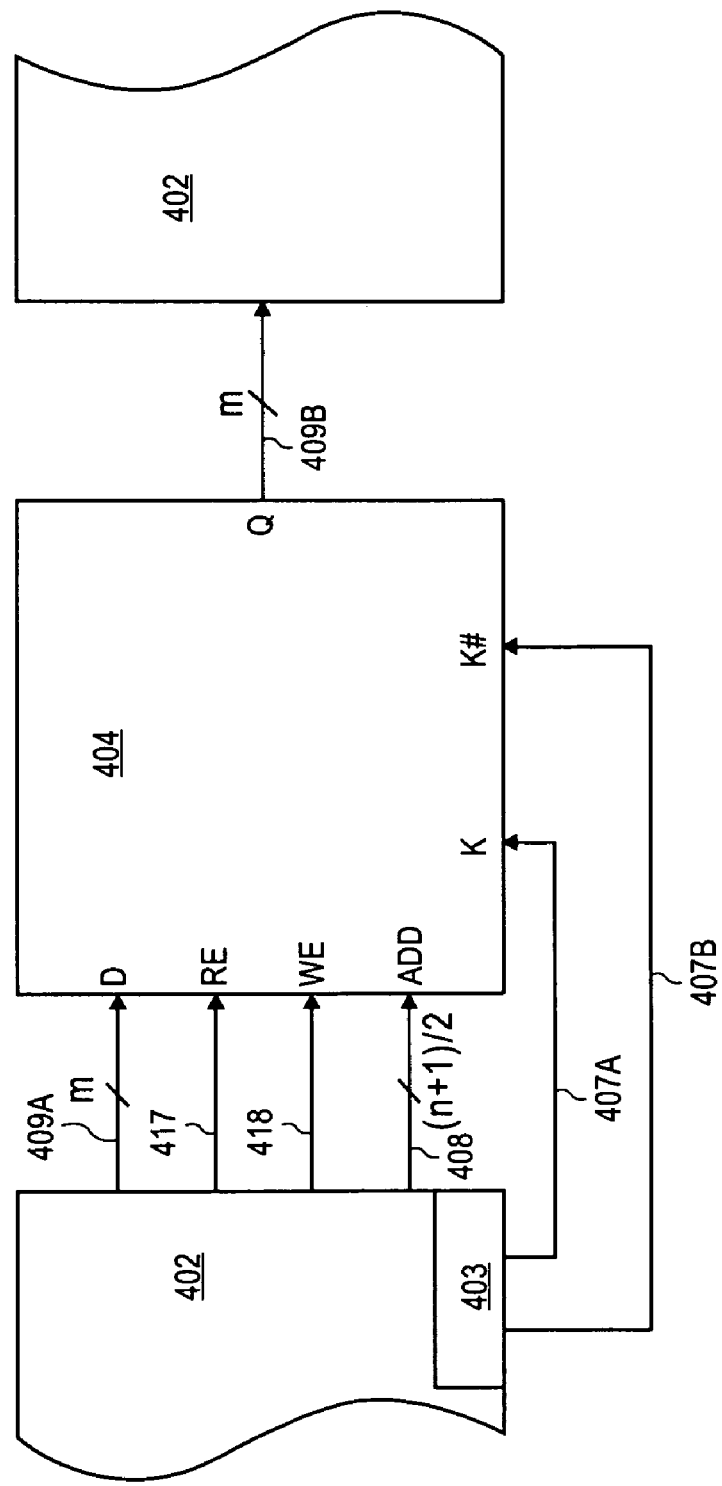
FIG. 5B illustrates another embodiment of addressing a synchronous RAM device.

In one embodiment, a memory device 404 may be a synchronous RAM device connected to processing device 402, as illustrated in FIG. 5A. Memory device 404 may have a data input D connected to processing device 402 by data bus 409a. Data bus 409a may have m data lines. Memory device 404 may also have a data output Q connected to processing device 402 by data bus 409b. Data bus 409b may have m lines. Data input D and data output Q may be the same physical interface and data bus 409a and data bus 409b may be the same physical data bus. Memory device 404 may have a read enable input RE connected to processing device 402 by read enable line 417, to enable data to be read from memory device 404. Memory device 404 may also have a write enable input WE connected to processing device 402 by write enable line 418, to enable data to be written to memory device 404. Memory device 404 may also have clock inputs k and k#, connected to processing device 402 by clock lines 407a and 407b, to receive clock signals from clock generator 403. In one embodiment, clock signal k on clock line 407a and clock signal k# on clock line 407b may be complementary clock signals. Memory device 404 may have an address input ADD, connected to processing device 402 by system address bus 408, to receive memory address segments from processing device 402. Memory device 404 may be an m×$x_2$' memory. In one embodiment, as illustrated in FIG. 5A, n may be an even number and memory device 404 may have n/2 address inputs. In another embodiment, as illustrated in FIG. 5B, n may be an odd number and memory device 404 may have (n+1)/2 address inputs. It should be noted that memory device 404 may also include other inputs and outputs that have not been illustrated so as not to obscure an understanding of embodiments of the present invention.

Figure 6:
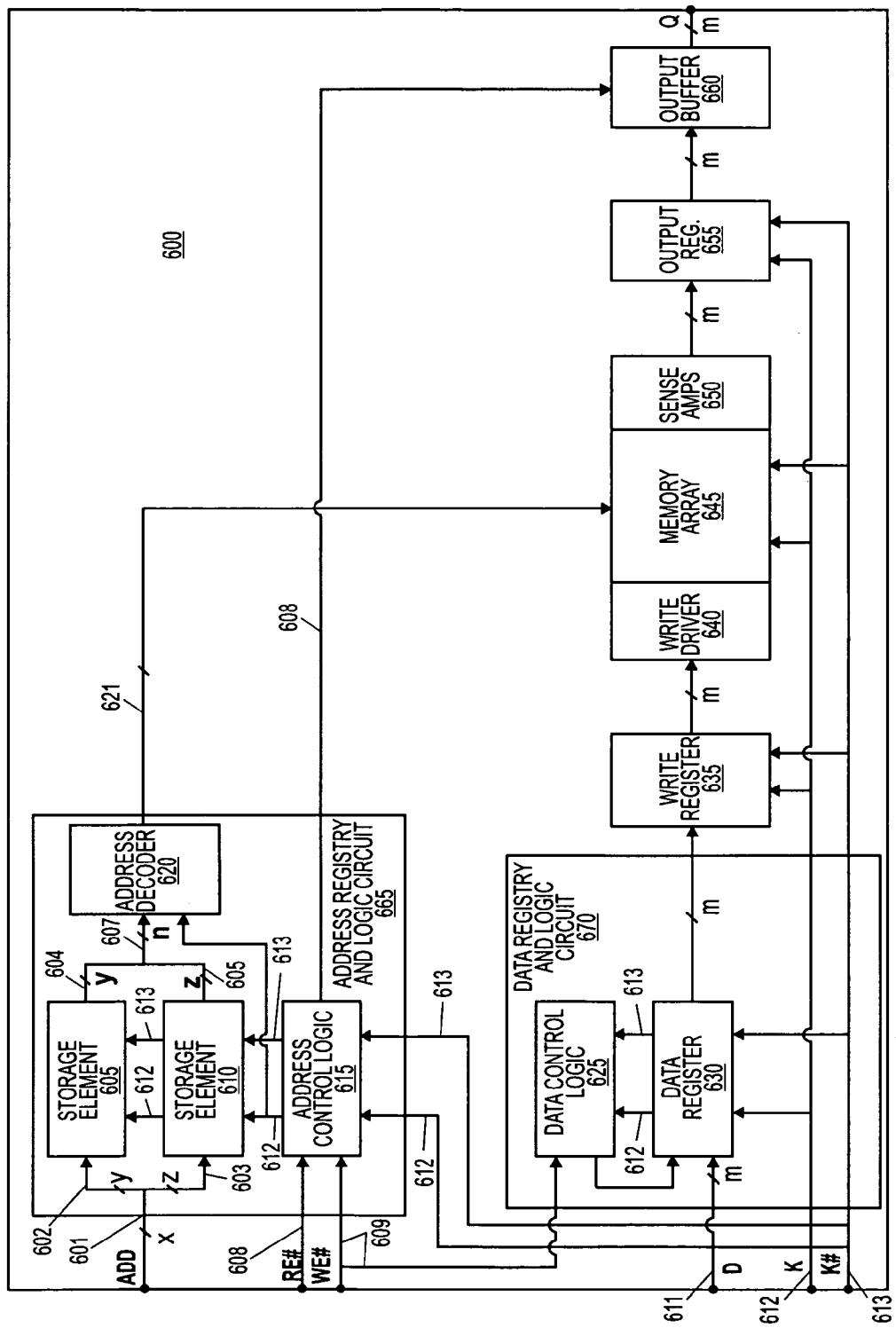
FIG. 6 illustrates one embodiment of address selection in a synchronous RAM device.

FIG. 6 illustrates one embodiment of address selection in a synchronous RAM device. Synchronous RAM device 600 may include an address registry and logic circuit 665 to receive and process memory address segments. Address registry and logic circuit 665 may include storage element 605 to store a first address segment, storage element 610 to store a second address segment, address control logic 615 to manage clock signals k and k#, and address decoder 620. Each of storage elements 605 and 610 may be registers or latches or any other type of storage element known in the art. Input address bus 601 may contain x lines and may receive address segments from system address bus 408 to transmit to storage elements 605 and 610 through buses 602 and 603, respectively. Storage element 605 may have y inputs and y outputs and each of buses 602 and 604 may have y lines. Storage element 610 may have z inputs and z outputs and each of buses 603 and 606 may have z lines. Buses 603 and 606 may be coupled to address decoder 620 through internal address bus 607, which may have n lines. Address decoder 620 may also be coupled to device memory array 645 by decoded address lines 621. Device memory array 645 may contain $2^n$ addressable memory locations. In one embodiment, n may be an even number, x may be equal to n/2, and both y and z may be equal to n/2 such that y+z may be equal to n. In another embodiment, n may be an odd number, x may be equal to (n+1)/2, and one of y or z may be equal to (n+1)/2 while the other of y or z may be equal to (n−1)/2 such that y+z may be equal to n. Synchronous RAM device 600 may also include data registry and logic circuit 670 to receive and process data. Data registry and logic circuit 670 may include data register 630 to receive input data from data bus 611, and control logic 625 to manage data register 630.

In one exemplary embodiment of address selection for a data read operation, a read enable signal may be issued from processing device 402 and received by synchronous RAM device 600 at read enable input RE#. Address control logic 615 may receive the read enable signal on line 608 and couple the read enable signal to output buffer 660 to enable data output. Address control logic 615 may also control the application of clock signals k and k# to storage elements 605 and 610, and to address decoder 620. Clock signals k and k# may be two-state (i.e., binary) signals having periodic state-transitions. Clock signals k and k# may also be complementary signals. On a first state-transition of clock signal k, address control logic 615 may cause a first read address segment on input address bus 601 to be stored in storage element 605. On a first state-transition of clock signal k#, address control logic 615 may cause a second read address segment on input address bus 602 to be stored in storage element 610. On a second state-transition of clock signal k, address control logic 615 may cause an internal read address, formed from the first and second read address segments, to be transmitted on internal address bus 607 to address decoder 620. Address decoder 620 may send a decoded memory address to memory array 645 where the contents of the memory location specified by the internal address are retrieved and transported to data output Q by way of sense amps 650, output register 655, and output buffer 660 on subsequent transitions of clock signals k & k#. Data output operations are known in the art; accordingly, a detailed description is not provided herein.

In one exemplary embodiment of address selection for a data write operation, a write enable signal may be issued from processing device 402 and received by synchronous RAM device 600 at write enable input WE#. Data control logic 625 may receive the write enable signal on line 609 and couple the write enable signal to data register 630 to enable data input. Data control logic 615 may also control the application of clock signals k and k# to data register 630. Address control logic 615 may receive the write enable signal on line 609 and control the application of clock signals k and k# to storage elements 605 and 610, and to address decoder 620. Clock signals k and k# may be periodic two-state (i.e., binary) signals. Clock signals k and k# may also be complementary signals. On a first state-transition of clock signal k, address control logic 615 may cause a first write address segment on input address bus 601 to be stored in storage element 605 and data control logic 625 may cause data at input D to be stored in data register 630. On a first state-transition of clock signal k#, address control logic 615 may cause a second write address segment on input address bus 602 to be stored in storage element 610 and data in data register 630 may be transferred to write register 635. On a second state-transition of clock signal k, address control logic 615 may cause an internal write address, formed from the first and second write address segments, to be transmitted on internal address bus 607 to address decoder 620. Address decoder 620 may send a decoded memory address to memory array 645 where the memory location specified by the internal write address is filled with the data from write register 635 through write driver 640. Data write operations are known in the art; accordingly, a detailed description is not provided herein. It should be noted that synchronous RAM device 600 may include additional inputs, outputs, components and couplings that have not been illustrated so as not to obscure understanding of embodiments of the present invention.

Figure 7A:
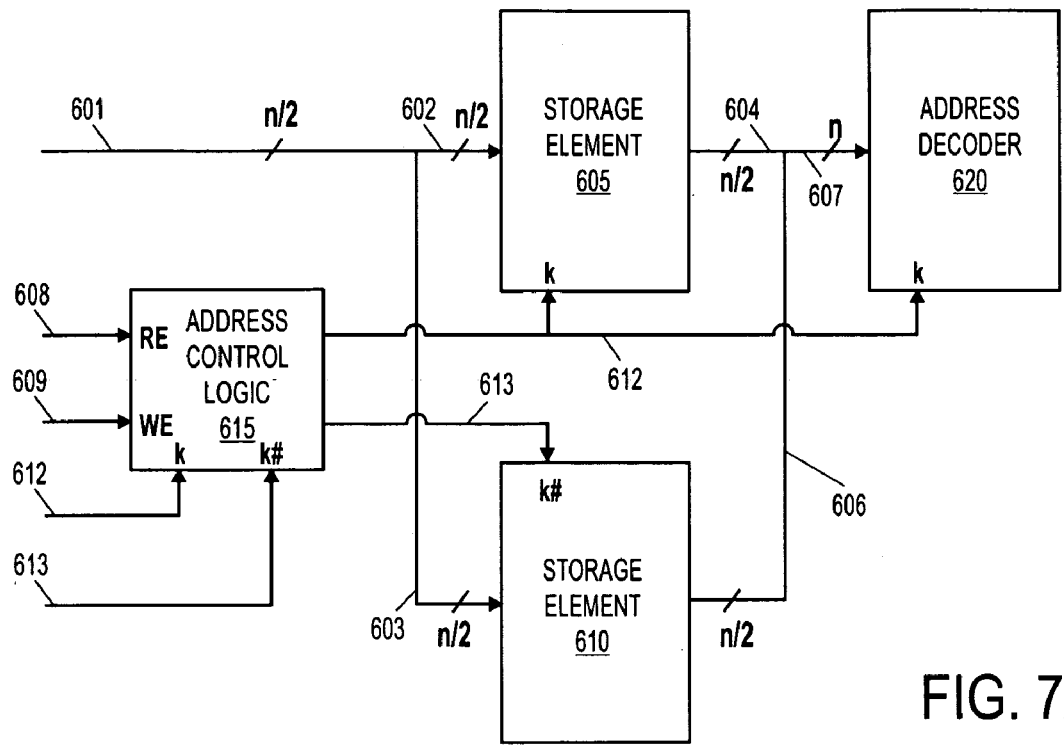
FIG. 7A illustrates one embodiment of address selection.

FIG. 7A illustrates one embodiment of address selection for the case of the n number of internal address bus lines being an even number. Storage element 605 may have n/2 inputs and n/2 outputs, and buses 602 and 604 may each have n/2 lines. Storage element 610 may have n/2 inputs and n/2 outputs, and buses 603 and 606 may each have n/2 lines. Internal address bus 607 may have n lines. Address control logic 615 couples clock signal k on clock line 612 to storage element 605 and address decoder 620, and clock signal k# on clock line 613 to storage element 610. Processing device 402 may assert a read enable signal on line 608 that is coupled to address control logic 615. Alternatively, processing device 402 may assert a write enable signal on line 609 that is coupled to address control logic 615. In the embodiment, processing device 402 may transmit the first n/2 bits of an n-bit address to input address bus 601 at input ADD.

On a transition of clock signal k, the first n/2 bits of the n-bit address may be stored in storage device 605 through buses 601 and 602. Processing device 402 may then transmit the last n/2 bits of the n-bit address to input address bus 601 at input ADD. On a transition of clock signal k#, the last n/2 bits of the n-bit address may be stored in storage device 610 through buses 601 and 603. On the next transition of clock signal k, the first n/2 bits of the n-bit address in storage element 605, and the last n/2 bits of the n-bit address in storage element 610 may be transmitted to address decoder 620 over buses 604 and 606, respectively, via internal address bus 607.

Figure 7B:
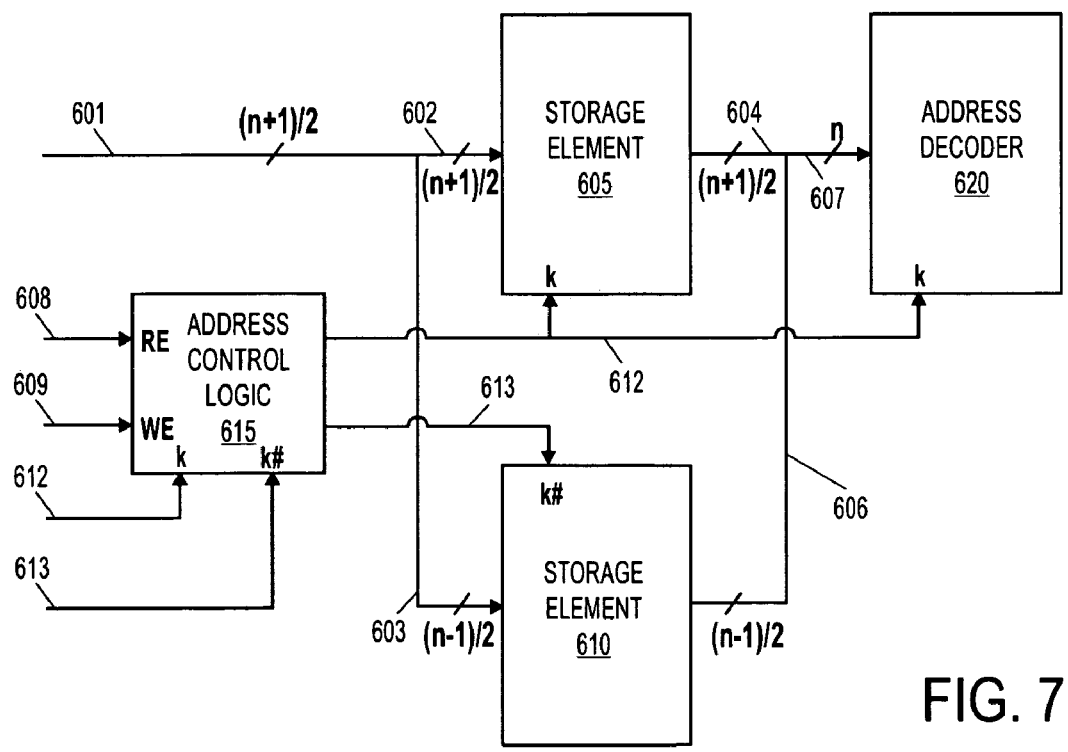
FIG. 7B illustrates another embodiment of address selection.

FIG. 7B illustrates one embodiment of address selection for the case of the n number of internal address bus lines being an odd number. Storage element 605 may have (n+1)/2 inputs and (n+1)/2 outputs, and buses 602 and 604 may each have (n+1)/2 lines. Storage element 610 may have (n−1)/2 inputs and (n−1)/2 outputs, and buses 603 and 606 may each have (n−1)/2 lines. Internal address bus 607 may have n lines. Address control logic 615 couples clock signal k on clock line 612 to storage element 605 and address decoder 620, and clock signal k# on clock line 613 to storage element 610. Processing device 402 may assert a read enable signal on line 417 that is coupled to address control logic 615 by line 608. Alternatively, processing device 402 may assert a write enable signal on line 418 that is coupled to address control logic 615 by line 609. In the embodiment, processing device 402 may transmit the first (n+1)/2 bits of an n-bit address to input address bus 601 at input ADD. On a transition of clock signal k, the first (n+1)/2 bits of the n-bit address may be stored in storage device 605 through buses 601 and 602. Processing device 402 may then transmit the last (n−1)/2 bits of the n-bit address to input address bus 601 at input ADD. On a transition of clock signal k#, the last (n−1)/2 bits of the n-bit address may be stored in storage device 610 through buses 601 and 603. On the next transition of clock signal k, the first (n+1)/2 bits of the n-bit address in storage element 605, and the last (n−1)/2 bits of the n-bit address in storage element 610 may be transmitted to address decoder 620 over buses 604 and 606, respectively, via internal address bus 607.

Figure 8:
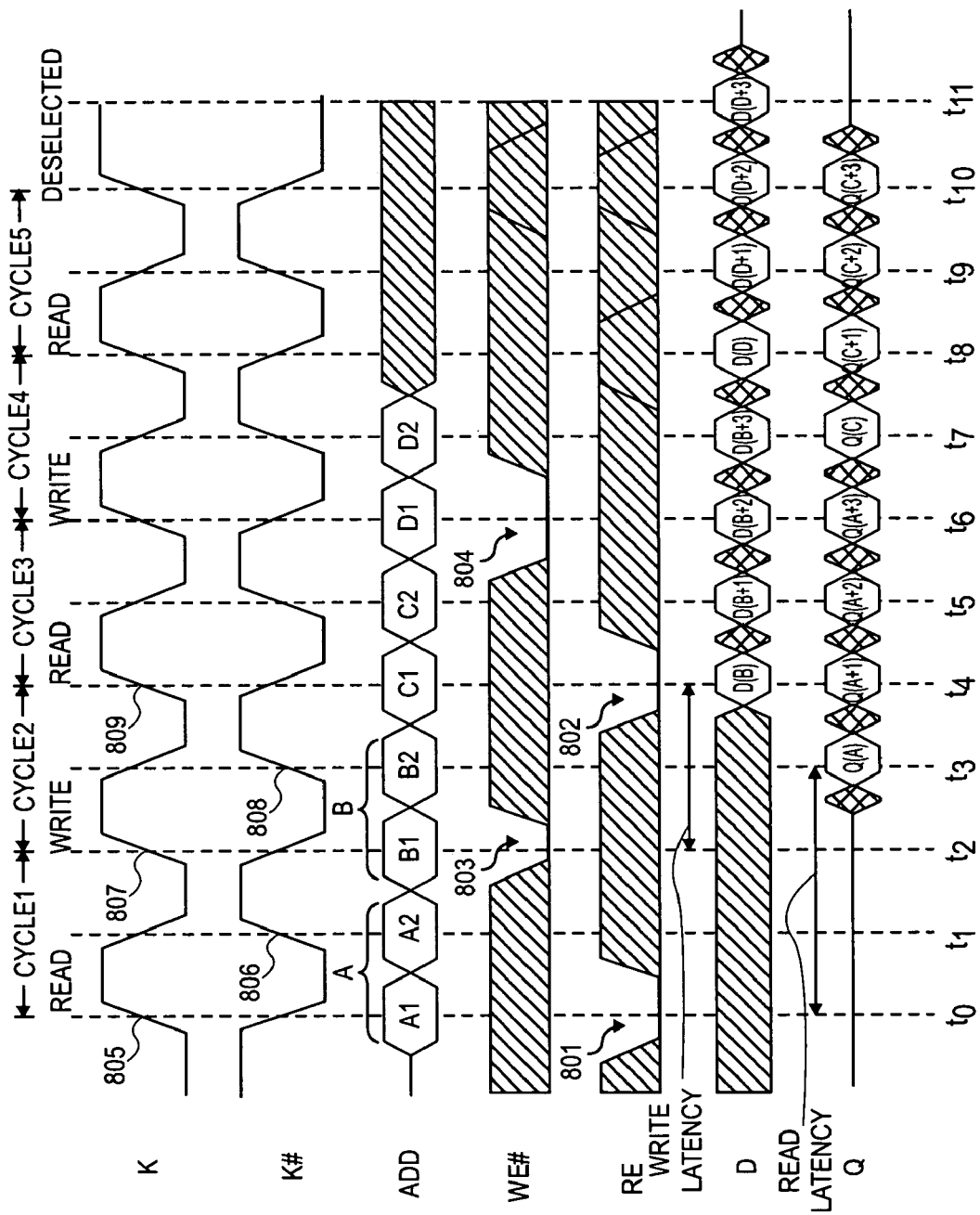
FIG. 8 is a timing diagram illustrating one embodiment of address selection in a synchronous RAM device.

FIG. 8 is a timing diagram illustrating one embodiment of address selection in a synchronous RAM device. In the exemplary embodiment, and with reference also to FIG. 6, the synchronous RAM device may be a burst-of-four QDR™ synchronous SRAM having a READ latency of 1½ clock cycles and a WRITE latency of 1 clock cycle, where times $t_0$ through $t_{11}$ correspond to alternate rising edges of synchronizing clock signals k and k#.

An exemplary burst-read sequence begins when processing device 402 asserts a read enable signal 801 at read enable input RE of synchronous RAM device 600. The read enable signal is transmitted to address control logic 615 by line 608. Address control logic 615 controls the application of clock signals k and k# to storage elements 605 and 610. Address control logic 615 also controls the application of the read enable signal to output buffer 660 to enable output port Q. At time $t_0$, the first segment A1 of address A is stored in storage element 605. At time $t_1$, the second segment A2 of address A is stored in storage element 610. At time $t_2$, address A is transferred to address decoder 620 and address A is decoded. Address decoders are known in the art; accordingly, a detailed description is not provided herein. At time $t_3$, the data stored at address (A) is read from device memory array 645 through sense amps 650 and latched into output register 655 where it is available through output buffer 660 as output data Q(A). Memory arrays, sense amps and buffers are known in the art; accordingly, a detailed description is not provided herein. At time $t_4$, a read address counter (not shown) is incremented, and the data stored at address (A+1) in device memory array 645 is latched into the output register 655 where it is available through output buffer 660 as output data Q(A+1). At time $t_5$, the read address counter is incremented again and the data stored at address (A+2) in device memory array 645 is latched into the output register 655 where it is available through output buffer 660 as output data Q(A+2). At time $t_6$, the read address counter is incremented again and the data stored at address (A+3) in device memory array 645 is latched into the output register 655 where it is available through output buffer 660 as output data Q(A+3). It will be appreciated by one having ordinary skill in the art that a similar sequence of operations may be performed with read address segments C1 and C2 from time $t_4$ through time $t_6$, following the assertion of a read enable signal 802 by processing device 402 at time $t_4$, to produce outputs Q(C) through Q(C+3) during time $t_7$ through time $t_{10}$.

An exemplary burst-write operation begins when processing device 402 asserts a write enable signal 803 at write enable input WE of synchronous RAM device 600. The write enable signal is transmitted to address control logic 615 and data control logic by lines 609. Data control logic 625 controls the application of clock signals k and k# to data register 630. Data control logic 625 also controls the application of the write enable signal to data register 630 to enable input port D. At time $t_2$, the first segment B1 of address B is stored in storage element 605 and data at data input D is latched into data register 630. At time $t_3$, the second segment B2 of address B is stored in storage element 610, the data in data register 630 is pipelined to write register 635, and the next data at input D is latched into data register 630. At time $t_4$, address B is transferred to address decoder 620, address B is decoded and the data in write register 635 is written to memory address B in device memory array 645 as D(B) by write driver 640. Write drivers are known in the art; accordingly, a detailed description is not provided herein. Also at time $t_4$, the data in data register 630 is pipelined to write register 635 and the next data at input D is latched into data register 630. At time $t_5$, a write address counter (not shown) is incremented, the data in write register 635 is written to memory address B+1 in device memory array 645 as D(B+1) by write driver 640. Also at time $t_5$, the data in data register 630 is pipelined to write register 635 and the next data at input D is latched into data register 630. At time $t_6$, the write address counter is incremented again, the data in write register 635 is written to memory address B+2 in device memory array 645 as D(B+2) by write driver 640. Also at time $t_6$, the data in data register 630 is pipelined to write register 635. At time $t_7$, the write address counter is incremented again, the data in write register 635 is written to memory address B+3 in device memory array 645 as D(B+2) by write driver 640. It will be appreciated by one having ordinary skill in the art that a similar sequence of operations may be performed with write address segments D1 and D2 from time $t_6$ through time $t_8$, following the assertion of a write enable signal 804 by the processing device 402 at time $t_6$, to write data to addresses (D) through (D+3) during time $t_8$ through time $t_{11}$.

Figure 9:
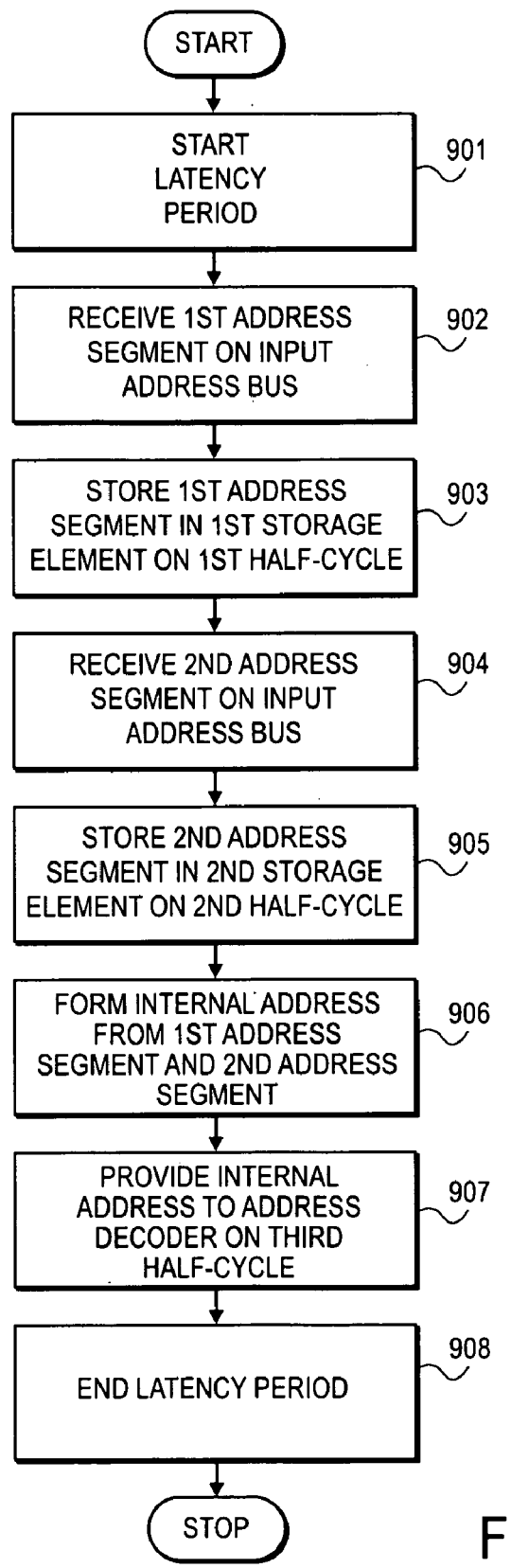
FIG. 9 illustrates one embodiment of a method of read/write address selection in a synchronous RAM device.

FIG. 9 illustrates one embodiment of a method of read/write address selection in a synchronous RAM device. This method provides for address selection during a latency period between the assertion of a read enable or write enable command and the time when a decoded read address or write address is required for memory access. Within the latency period, the memory address is specified in segments and then reconstructed for address decoding. In an exemplary embodiment, synchronous RAM device 600 receives a read enable signal 801, which starts the latency period, step 901. First storage element 605 receives a first address segment A1 on input address bus 601, step 902. The first address segment A1 is stored in the first storage element 605 on a first half-cycle 805, step 903. Second storage element 610 receives a second address segment A2 on input address bus 601, step 904. The second address segment A2 is stored in the second storage element 610 on a second half-cycle 806, step 905. The internal address A is formed from first address segment A1 and second address segment A2, step 906. Internal address A is provided to address decoder 620 on a third half cycle 807, step 907, which terminates the latency period, step 908.

It will be appreciated that the method may be applied to write address selection by substituting write enable signal 803 for read enable signal 801, write address segment B1 for read address segment A1, half-cycle 807 for half-cycle 805, address segment B2 for address segment A2, half-cycle 808 for half-cycle 806, internal address B for internal address A, and half-cycle 809 for half-cycle 807.

Accordingly, embodiments of the invention enable the reduction of the number of memory address lines in a networking or data communications application by approximately a factor of two, without reducing the amount of addressable memory or increasing memory access time.

It should be appreciated that references throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. An apparatus, comprising:
   a first storage element to store a first address segment, the first storage element having a plurality of inputs and a plurality of outputs equal to the plurality of inputs;
   a second storage element to store a second address segment, the second storage element having a plurality of inputs and a plurality of outputs equal to the plurality of inputs;
   an input address bus coupled to the plurality of inputs of the first storage element and the plurality of inputs of the second storage element; and
   an internal address bus coupled to the plurality of outputs of the first storage element and the plurality of outputs of the second storage element, the internal address bus to carry an internal address comprising the first address segment from the first storage element and the second address segment from the second storage element.

2. The apparatus of claim 1, further comprising:
   a first clock signal line coupled to the first storage element; and
   a second clock signal line coupled to the second storage element.

3. The apparatus of claim 2, wherein:
   the input address bus comprises a plurality of lines equal in number to the plurality of inputs of the first storage element;
   the plurality of inputs of the second storage element is equal to or less than the plurality of inputs of the first storage element; and
   the internal address bus comprises a plurality of lines equal in number to the sum of the plurality of outputs of the first storage element and the plurality of outputs of the second storage element.

4. The apparatus of claim 3, wherein:
   the first address segment is stored upon a first transition of a first clock signal applied on the first clock signal line;
   the second address segment is stored upon a first transition of the second clock signal applied on the second clock signal line; and
   an address comprising the first address segment and the second address segment is transmitted on the internal address bus upon a second transition of the first clock signal on the first clock signal line.

5. The apparatus of claim 4, wherein the first clock signal and the second clock signal are complementary clock signals.

6. The apparatus of claim 5, wherein at least one of the first storage element and the second storage element is a latch.

7. The apparatus of claim 5, wherein at least one of the first storage element and the second storage element is a register.

8. The apparatus of claim 5, further comprising:
   an address control logic coupled to the first clock signal line and the second clock signal line;
   an address decoder coupled to the internal address line; and
   a memory array coupled to the address decoder.

9. The apparatus of claim 8, wherein the apparatus comprises a synchronous random access memory.

10. The apparatus of claim 9, wherein the synchronous random access memory comprises a static random access memory (SRAM).

11. The apparatus of claim 10, wherein the SRAM comprises a quad data rate SRAM.

12. A method, comprising:
    receiving, in a latency period, a first address segment and a second address segment on an input address bus;
    storing, in the latency period, the first address segment in a first storage element and the second address segment in a second storage element, the first and second address segments being stored on consecutive half-cycles comprising a first half-cycle and a second half-cycle; and
    providing, in a third half-cycle in the latency period, an internal address to an address decoder, wherein the internal address comprises the first address segment and the second address segment.

13. The method of claim 12, wherein the internal address is a read address and the latency period is a latency between a read enable command and a read operation; and wherein a time period comprising the first half-cycle, the second half-cycle and the third half-cycle is less than or equal to the latency period.

14. The method of claim 12, wherein the internal address is a write address and the latency period is a latency between a write enable command and a write operation; and wherein a time period comprising the first half-cycle, the second half-cycle and the third half-cycle is less than or equal to the latency period.

15. The method of claim 12, wherein
storing the first address segment comprises latching the first address segment in a first register upon a first transition of a first clock signal; and
storing the second address segment comprises latching the second address segment in a second register upon a first transition of a second clock signal.

16. The method of claim 12, further comprising:
decoding the internal address; and
addressing a memory array with the decoded internal address.

17. The method of claim 13, wherein the read enable command comprises enabling a data read port and the read operation comprises reading data from the memory array from a location identified by the internal address.

18. The method of claim 17, wherein reading data from the memory array comprises reading at a double data rate.

19. The method of claim 14, wherein the write enable command comprises enabling a date write port, and the write operation comprises writing data to the memory array to a location identified by the internal address.

20. The method of claim 19, wherein reading data from the memory array comprises reading at a double data rate.

21. A system, comprising:
a processing device coupled to a data bus and a system address bus, the processing device comprising a clock signal generator to generate a first clock signal on a first clock signal line and a second clock signal on a second clock signal line;
at least one random access memory (RAM) coupled to the system address bus, the data bus, the first clock signal line and the second clock signal line, wherein each of the at least one random access memory comprises:
a first storage element coupled to the first clock signal line, to store a first address segment upon a first transition of the first clock signal, the first storage element having a plurality of inputs and a plurality of outputs equal to the plurality of inputs;
a second storage element coupled to the second clock signal line, to store a second address segment upon a first transition of the second clock signal, the second storage element having a plurality of inputs and a plurality of outputs equal to the plurality of inputs;
an input address bus coupled to the plurality of inputs of the first storage element and the plurality of inputs of the second storage element; and
an internal address bus coupled to the plurality of outputs of the first storage element and the plurality of outputs of the second storage element.

22. The system of claim 21, wherein:
the input address bus comprises a plurality of lines equal in number to the plurality of inputs of the first storage element;
the plurality of inputs of the second storage element is equal to or less than the plurality of inputs of the first storage element; and
the internal address bus comprises a plurality of lines equal in number to the sum of the plurality of outputs of the first storage element and the plurality of outputs of the second storage element.

23. The system of claim 21, wherein the at least one RAM comprises synchronous RAM.

24. The system of claim 21, wherein the at least one RAM comprises a quad data rate synchronous RAM.

* * * * *